(12) United States Patent
Ravi et al.

(10) Patent No.: US 7,729,445 B2
(45) Date of Patent: Jun. 1, 2010

(54) DIGITAL OUTPHASING TRANSMITTER ARCHITECTURE

(75) Inventors: Ashoke Ravi, Hillsboro, OR (US); Mostafa A. Elmala, Tigard, OR (US); Richard B. Nicholls, Banks, OR (US); Yorgos Palaskas, Portland, OR (US); Krishnamurthy Soumyanath, Portland, OR (US); Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 917 days.

(21) Appl. No.: 11/528,812

(22) Filed: Sep. 27, 2006

(65) Prior Publication Data

US 2008/0075194 A1 Mar. 27, 2008

(51) Int. Cl.
*H04K 1/02* (2006.01)
(52) U.S. Cl. .................................... 375/297
(58) Field of Classification Search ............... 375/295, 375/296, 297, 300–305, 268, 269, 271, 279, 375/242–247, 254; 455/91, 114.2, 114.3, 455/39, 42, 108; 332/144, 145, 151; 370/215; 341/50, 76, 77, 143, 144, 126; 708/100, 708/200, 300, 307
See application file for complete search history.

(56) References Cited

U.S. PATENT DOCUMENTS

| 3,896,395 | A * | 7/1975 | Cox .................................. 330/53 |
| 6,094,458 | A * | 7/2000 | Hellberg ........................ 375/242 |
| 2002/0027958 | A1* | 3/2002 | Kolanek ........................ 375/297 |
| 2003/0107435 | A1* | 6/2003 | Gu .................................. 330/149 |
| 2004/0266365 | A1* | 12/2004 | Hasson et al. .................. 455/91 |
| 2005/0271161 | A1* | 12/2005 | Staszewski et al. ........... 375/308 |

OTHER PUBLICATIONS

Zhang et al, "Gain and Phase Error-Free LINC Transmitter", IEEE Transactions on Vehicular Technology, vol. 49. No. 5, Sep. 2000, pp. 1986-1994.*
Barkin et al. "A CMOS Oversampling Bandpass Cascaded D/A Converter with Wigital FIR and Current-Mode Semi-Digital Filtering", IEEE Journal of Solid State Circuits, vol. 39, No. 4, Apr. 2004, pp. 585-593.*

* cited by examiner

*Primary Examiner*—David C Payne
*Assistant Examiner*—Vineeta S Panwalkar
(74) *Attorney, Agent, or Firm*—Blakely, Sokoloff, Taylor & Zafman LLP (57) ABSTRACT

Architectures including digital outphasing transmitters. Digital signal generation circuitry generates at least two base-band sinusoid signals. Bandpass modulation circuitry is coupled to receive the base-band sinusoid signals and generates at least two modulated digital signals. Power amplifiers are coupled to receive the modulated digital signals to amplify the modulated digital signals. The amplified modulated signals are combined and transmitted.

14 Claims, 13 Drawing Sheets

DIGITAL OUTPHASING TRANSMITTER ARCHITECTURE

TECHNICAL FIELD

Embodiments of the invention relate to techniques for wireless communications. More particularly, embodiments of the invention relate to an outphasing transmitter system using multiple constant envelope digital signals.

BACKGROUND

Current radio transceivers include analog transmit and receive chains with multiple stages of gain and filtering with circuits sensitive to process and temperature variations. These transmit chains generally include a large number of inductors that are not compatible with low-resistivity substrates used with digital CMOS (Complementary Metal Oxide Semiconductor) processes. These transmit chains require a relatively large die area and do not scale with subsequent process generations.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

In the description that follows, several architectures that may be used, for example, to provide relatively inexpensive digital transmitters in deeply scaled digital CMOS processes. Contrary to conventional mixer and synthesizer based transmitters, the architectures described herein generally require fewer precision analog components, offer higher efficiency, are more immune to spectral regrowth (e.g., from path imbalances), are compatible with digital calibration, correction and/or adaptation algorithms, and/or have higher yield and reliability.

The architectures described herein may provide one or more of the following advantages over current transmitters. The use of out-phasing amplifiers may allow high-efficiency across wide power variation (suitable for OFDM signaling), with relatively low distortion. Most current radio transceivers employ analog transmit and receive chains with multiple stages of gain and filtering with circuits sensitive to process and temperature. The transmit chains employ a large number of inductors which are not compatible with the low-resistivity substrates of a scaled digital CMOS process. They also occupy large die areas and do not scale with process generation. The architectures described herein allow a transmit chain using digital circuits and switching power amplifiers that scale well with process and are robust to manufacturing variations.

For a given transmission protocol, the power dissipation in the modulator may decrease with each generation of process scaling unlike in traditional analog implementations. The architecture described herein may be scalable and be scan re-configured for different standards (multi-mode radio) through switching in and out logic gates and varying the clock frequency. The architectures may utilize high efficiency digital techniques enabling the use of switching power amplifiers for the generation of wideband modulation signals exhibiting significant envelope variation.

Unlike traditional class-D pulse width modulation schemes, the architecture described herein may guarantees a minimum pulse width. This may ensure that the switching pulse width is not shorter than the minimum gate delay. The time interleaving, heterodyning and outphasing described herein may reduce or even minimize power dissipation in the modulator and drive circuitry. Due to the digital generation of the quadrature signals, there may not be matching or skew constraints in the modulator. Jitter may be a consideration only in the final re-timing latches.

The architectures described herein may utilize a combined digital-to-analog converter (DAC) with a semi-digital filter, which may reduce near quantization noise of the out-phasing modulators. Traditional implementations of outphasing have relied on analog extraction of the phase-modulation signals, which have limited bandwidth and dynamic range. In the architectures described herein the extraction may be performed digitally (to required degree of precision) at low frequencies with a negligible power dissipation penalty.

In traditional analog/analog based outphasing transmitters, the limiting action of the switching power amplifier creates significant spectral regrowth. In various embodiments of the architectures described herein, the waveform driving the switching power amplifier may be encoded into a binary or ternary signal by the modulator and therefore may pass through the limiter without experiencing any spectral regrowth. As described in greater detail below, use of two power amplifiers may allow each to deliver only half the power. This may enable the use of lower supply voltages.

Also, because each device delivers only half the peak power each power amplifier could have higher efficiency and avoid breakdown voltage and reduce hot-carrier effects. Together with digital calibration, this can potentially facilitate delivering high maximum output power level to the load.

As described in greater detail below, transmit architectures may include two or more power amplifiers, each of which may be driven by signal derived from two phasors. If two phasors with the same amplitude and centered at the same frequency with varying phases are added, an arbitrary amplitude and phase modulated waveform may be synthesized. The following equations describe this effect:

$$y_0 = A\cos(\omega t + \theta(t) + \phi(t)) + A\cos(\omega t + \theta(t) - \phi(t))$$

$$y_0 = A\cos(\phi(t))\cos(\omega t + \theta(t))$$

$$\phi(t) = \cos^{-1}\left(\frac{\sqrt{I^2(t) + Q^2(t)}}{A}\right)$$

$$\theta(t) = \tan^{-1} \cdot \left(\frac{Q(t)}{I(t)}\right)$$

Because two paths may correspond to constant envelope signals, switching power amplifiers can be used with a passive power combiner before the antenna.

Historically, the required signals to drive two power amplifiers have been generated using a combination of analog circuits and feedback techniques. The signal generation circuits have a limited dynamic range, are sensitive to process and temperature variations and can only support a limited bandwidth. As a result these approaches suffer from sever limitations in a scaled CMOS process for high data rate communications. An all digital modulator may be compatible with a relatively low cost, deeply scaled CMOS process and could occupy a small die area, draw less power, be generally immune to process and temperature considerations and could be designed with an arbitrary degree of accuracy.

Re-configurability, scalability, calibration and high efficiency are among many properties that are desirable in wireless transmitter architectures, particularly for portable devices. Typical problems associated with current transmitter architectures are IQ mismatch, AM-AM and AM-PM distortion, low breakdown voltage, etc. Described in greater detail below are architectures based on outphasing amplifiers and delta-sigma digital modulators that may avoid one or more of the problems associated with current transmitter architectures. Also described herein are techniques for calibration of the digital transmitter architectures. These digital transmitter architectures may be used, for example, in wireless local area network environment including MIMO (multiple input, multiple output) protocols (e.g., IEEE 802.11n).

IEEE 802.11n refers to IEEE 802.11 Task Group N, which was organized to define modifications to the Physical Layer and Medium Access Control Layer (PHY/MAC) to deliver 100 megabit-per-second (Mbps) or greater throughput. The result is an upcoming specification referred to as IEEE 802.11n that is an addition to the 802.11 family of standards that is intended to increase wireless network speed and reliability. The 802.11 family of standards includes, for example, IEEE 802.11b/g wireless local area network (WLAN) standards. IEEE 802.11b corresponds to IEEE Std. 802.11b—1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g—2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Related documents may include, for example, IEEE 802.11a.

Figure 1:
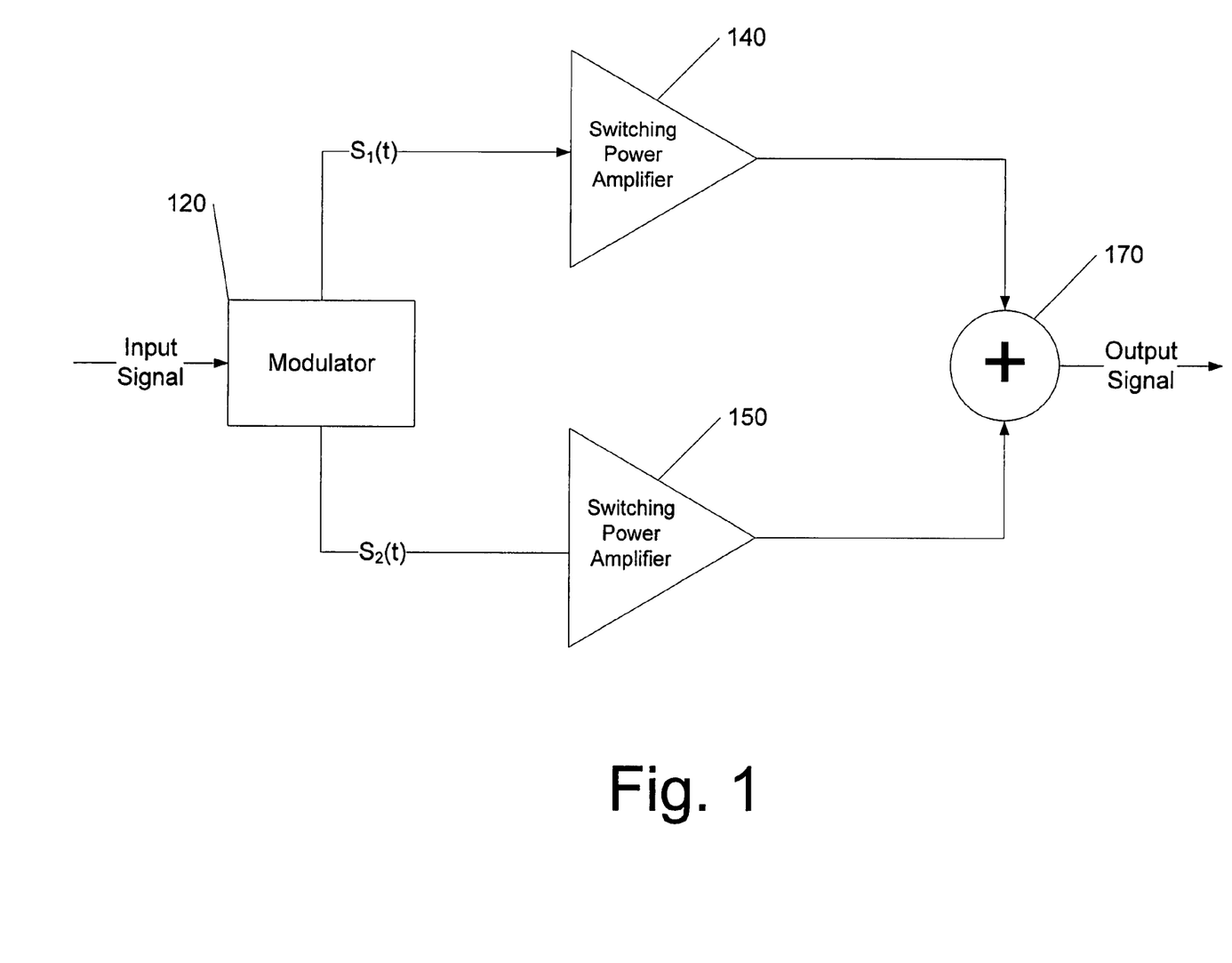
FIG. 1 is a block diagram of one embodiment of an outphasing amplifier transmitter system.

FIG. 1 is a block diagram of one embodiment of an outphasing amplifier transmitter system. In one embodiment, the transmitter system may include two power amplifiers, 140, 150, may be driven by two streams of constant envelope signals, $s_1(t)$ and $s_2(t)$, which may describe any amplitude and phase modulated signals. The output signals may be a summation of the two signals as generated by power combiner 170.

In one embodiment, modulator 120 may generate $s_1(t)$ and $s_2(t)$ by mapping amplitude into phase information. In one embodiment a digital signal processor (not illustrated in FIG. 1) may generate signals that may be up-converted, interpolated and passed through a delta-sigma modulator to obtain digitally coded signals at an IF frequency.

Described below are various architectures that support outphasing amplifier transmitter systems. In one embodiment, the required phase modulation signals for the two paths are based on a polar representation of the modulation and can be obtained from in-phase and quadrature components of the modulation signal using, for example, the CORDIC (COordinate Rotation DIgital Computer) algorithm. This algorithm may be implemented in the digital base-band of the radio and can be designed to an arbitrary degree of precision (arithmetic width). Because the extraction of the phase information occurs at the base-band rate the power dissipation involved in this computation is relatively low. In one embodiment, the two digital base-band sinusoids $\tilde{s}_1(t)$ and $\tilde{s}_2(t)$ required for outphasing may be digitally interpolated, upconverted and fed to a digital bandpass delta-sigma (D-S) modulator using the architectures described below.

Figure 2:
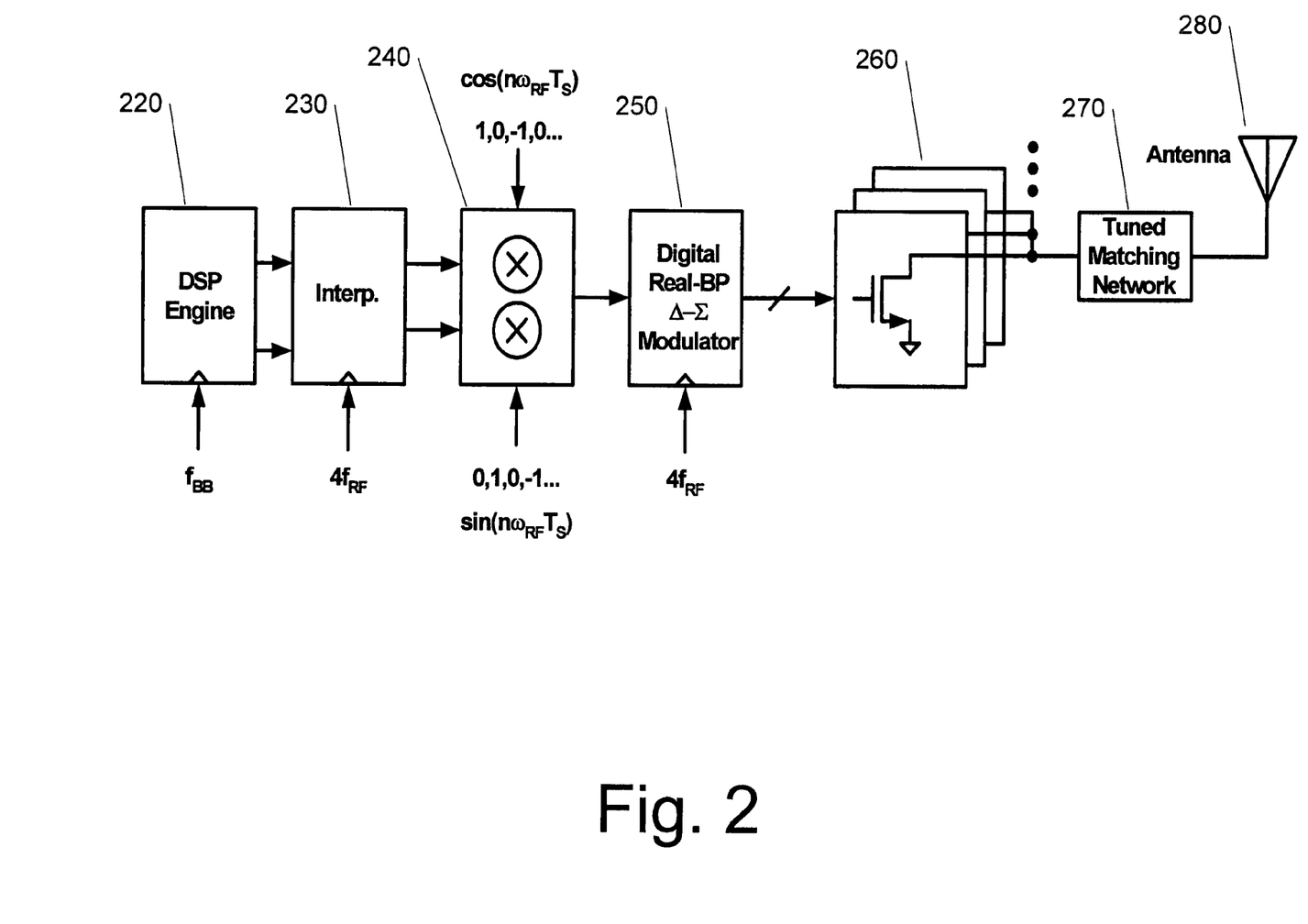
FIG. 2 is a high-level block diagram of one embodiment of a basic homodyne architecture.

FIG. 2 is a high-level block diagram of one embodiment of a basic homodyne architecture. In one embodiment, the input signal with a desired numerical precision (arithmetic width) may be generated by digital signal processing (DSP) circuitry 220 at the Nyquist rate of the baseband. Because DSP circuitry 220 is digital it may be reconfigured to generate the required modulation signal for use in, for example, WLAN (Wireless Local Area Network), WiMAX, Bluetooth, GSM/EDGE (Global System for Mobile communications/Enhanced Data GSM Environment) or W-CDMA (Wideband Code-Division Multiple Access) communications protocols. Other wireless protocols may also be supported. Bluetooth protocols are described in "Specification of the Bluetooth System: Core, Version 1.1," published Feb. 22, 2001 by the Bluetooth Special Interest Group, Inc. Associated as well as previous or subsequent versions (e.g., Version 2.0) of the Bluetooth standard may also be supported.

In one embodiment, the baseband signal may be interpolated to 4 times the desired RF carrier frequency ($f_{RF}$) by interpolator 230. In one embodiment, this process may employ a first stage of variable rate interpolation at low frequencies followed by interpolation by $2^k$ to reduce power dissipation.

In one embodiment, a multi-bit output from interpolator 230 may be digitally mixed up (by the mixing circuit 240) to the RF carrier frequency and provided as an input signal to digital bandpass delta-sigma ($\Delta$-$\Sigma$) modulator 250. In one embodiment, the digital mixing is not computationally prohibitive because the mixing may be accomplished by multiplication with a sequence (e.g., 1, 0, −1, 0 . . . ).

A real or complex bandpass delta-sigma modulator may exploit this property in simplifying the realization of the internal resonators. Modulator 250 may map the multi-bit input sequence into a binary or ternary output sequence such that the quantization noise is shaped to have a bandstop response. That is, the quantization noise may be suppressed in the desired frequency band and pushed out to out-of-band frequencies.

The output signal from modulator 250 may be use to drive two or more switching power amplifiers 260, which may generate a signal to be transmitted via tuned matching network 270 and antenna 280.

Figure 3:
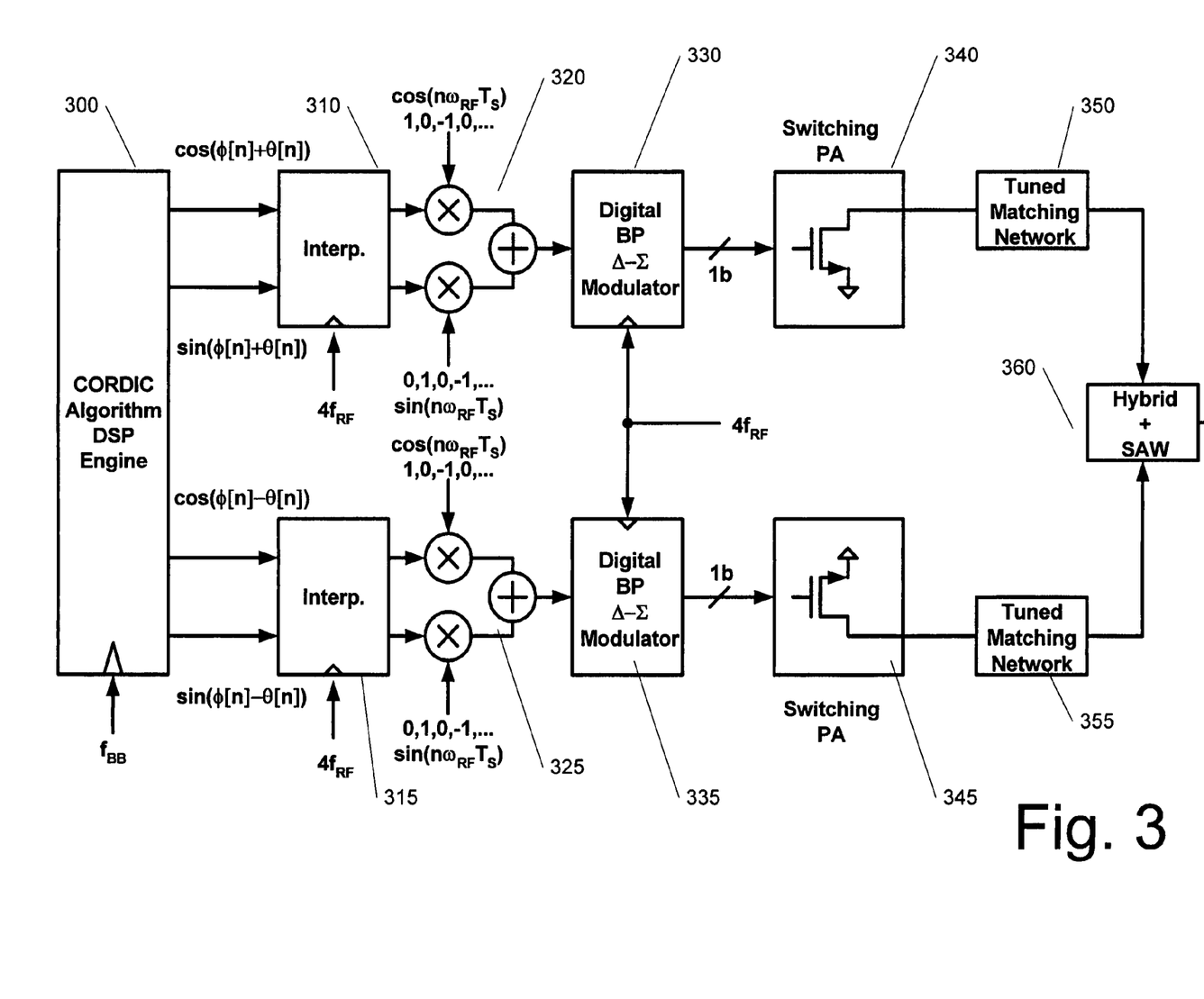
FIG. 3 is a block diagram of one embodiment of a basic homodyne architecture.

FIG. 3 is a block diagram of one embodiment of a basic homodyne architecture. In one embodiment, DSP engine 300 may generate two digital base-band sinusoid signals for each of two or more paths through the transmission circuit. In one embodiment, DSP engine 300 may be a CORDIC algorithm DSP engine; however, any type of DSP engine that is capable of generating the appropriate digital base-band signals may be used.

In one embodiment, each pair of digital base-band sinusoid signals may operate as input signals to interpolators (e.g., 310, 315) that may interpolate the input signals to a frequency that is a multiple (e.g., 2, 4, 8) of the base-band signal frequency.

In one embodiment, the interpolated digital signals may be mixed through multiplication with a binary or ternary sequence by mixing circuitry 320 and 325. Any type of mixing circuitry known in the art may be used. The mixed signals may be used as input signals to modulators. In one embodiment, as discussed above, power amplifiers 330 and 335 may be digital bandpass delta-sigma modulators. In one embodiment, the modulators are driven by a frequency that is four times the base-band frequency.

The one-bit output stream from modulators 330 and 335 may drive switching power amplifiers 340 and 345, respectively. Power amplifiers 340 and 345 may be realized using, for example, an inverter, an H-bridge or a switch transistor biased in class-D/E/F or biased in class-B/C and driven into saturation. In one embodiment, power amplifier output matching networks 350 and 355 and SAW filter 360 may suppress out-of-band noise. The resulting signal may be transmitted via one or more antennae (not illustrated in FIG. 3).

In one embodiment, the modulator order and quantization can be adapted and reconfigured on the fly through switching in and out logic blocks to meet the different bandwidth, spectral mask and EVM requirements of the different radio standards. Unlike traditional delta-sigma digital-to-analog converters the oversampling may be relative to the baseband and not the RF carrier.

Figure 4:
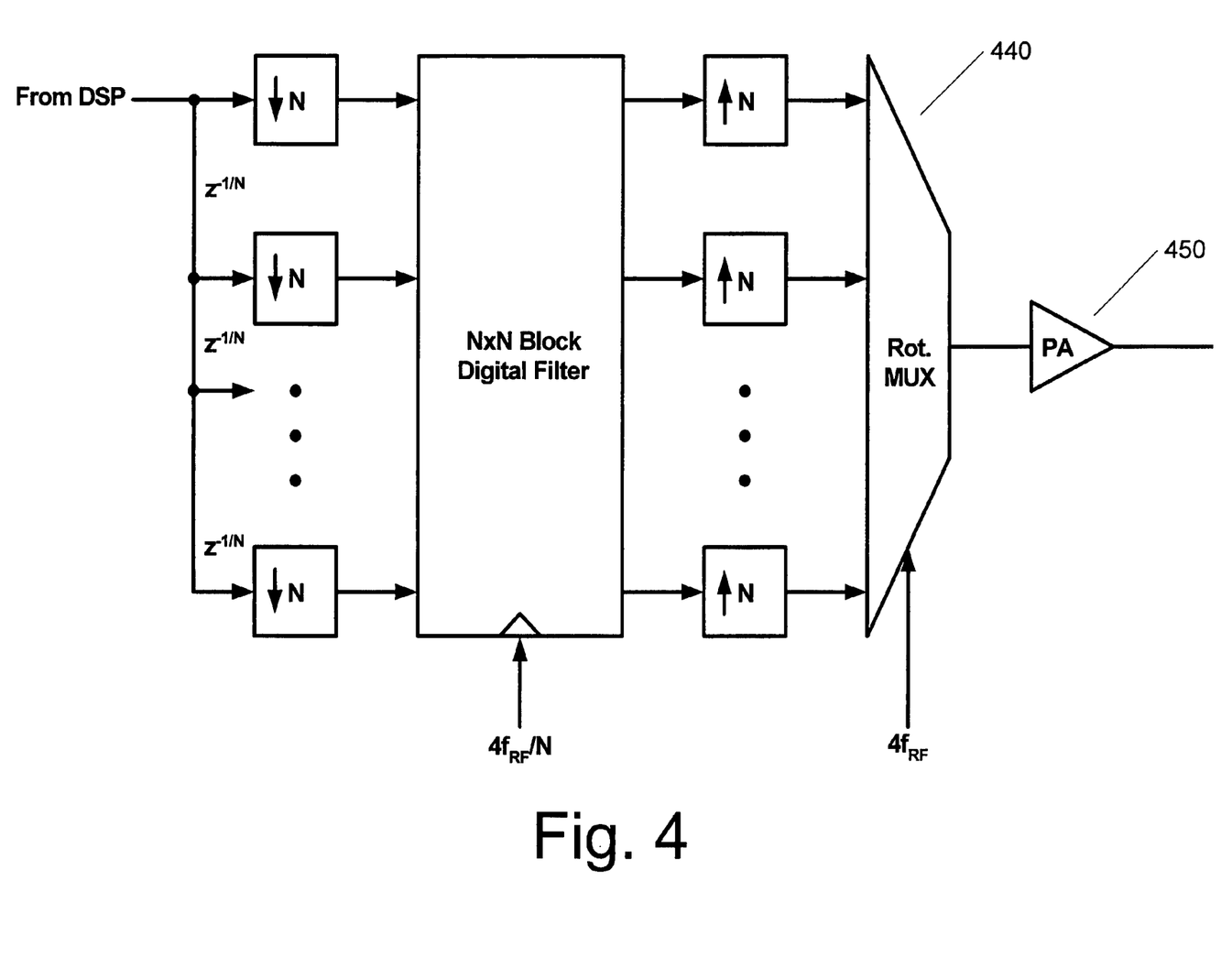
FIG. 4 is a block diagram of one embodiment of a time-interleaved digital transmitter.

FIG. 4 is a block diagram of one embodiment of a time-interleaved digital transmitter. In one embodiment, to reduce the power consumption caused by clocking the interpolator and delta-sigma modulator at four times the base-band frequency, parallelism may be exploited in the circuit design.

The interpolator and modulator may be realized using a polyphase implementation as illustrated in FIG. 4. In one embodiment, N multiple parallel streams may operate at 1/N times the original clock frequency with cross-coupling between the streams. The individual streams and coupling coefficients may be computed using the theory of block digital filters. This scheme may result in a power saving in the digital section of the order of $N^2$.

Figure 5:
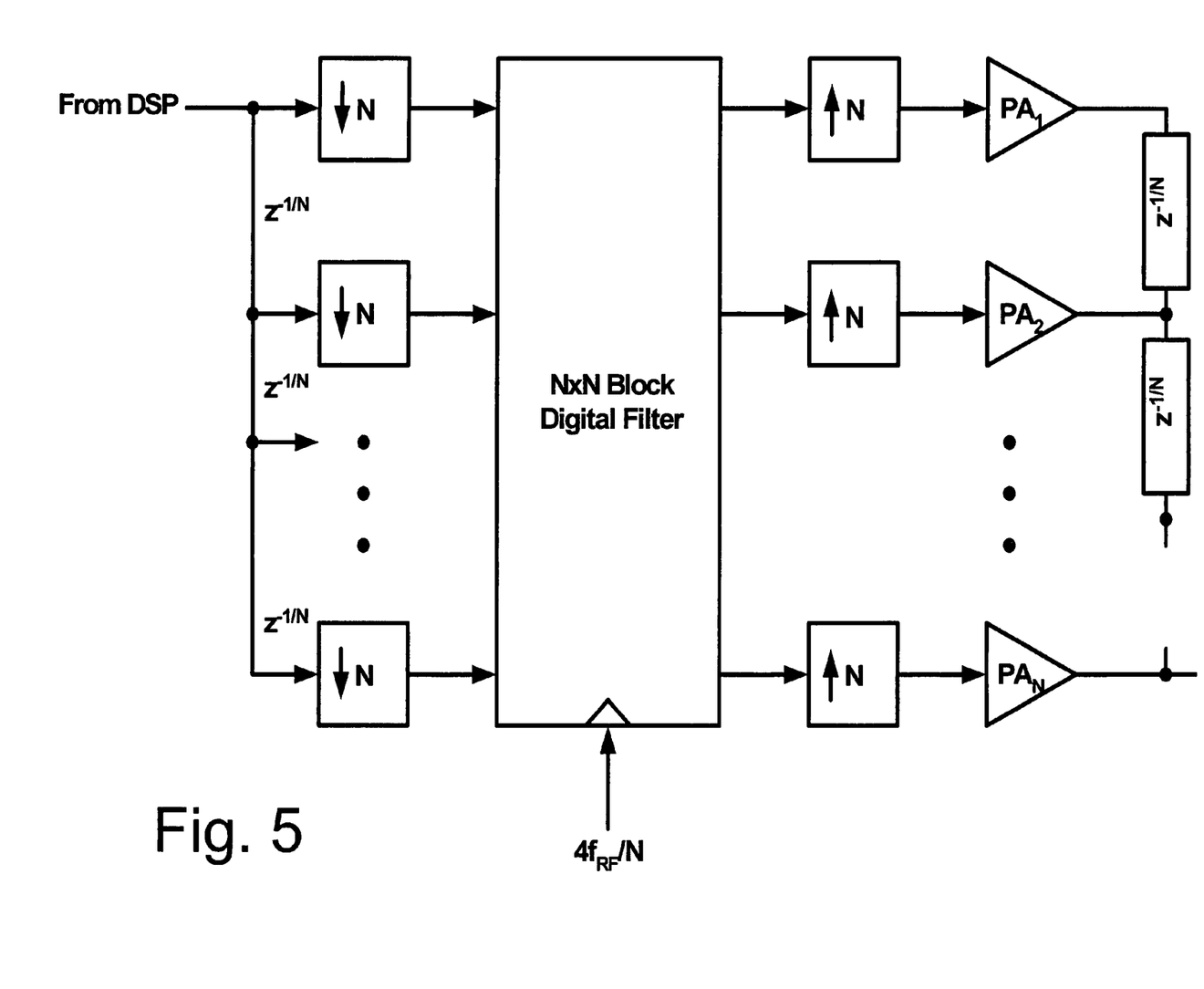
FIG. 5 is a block diagram of one embodiment of a time-interleaved digital transmitter with multiplexing performed after the power amplifiers.

A serializer multiplexor 440 may combine the outputs of the multiple streams and drive the power amplifiers 450 with a waveform switching at $4*f_{RF}$. As illustrated in FIG. 5, if the demultiplexing is performed after the power amplifiers, parallelism can be exploited to a greater extent. The architecture of FIG. 4 may require good matching between multiple paths and the use of a delay-line.

Figure 6:
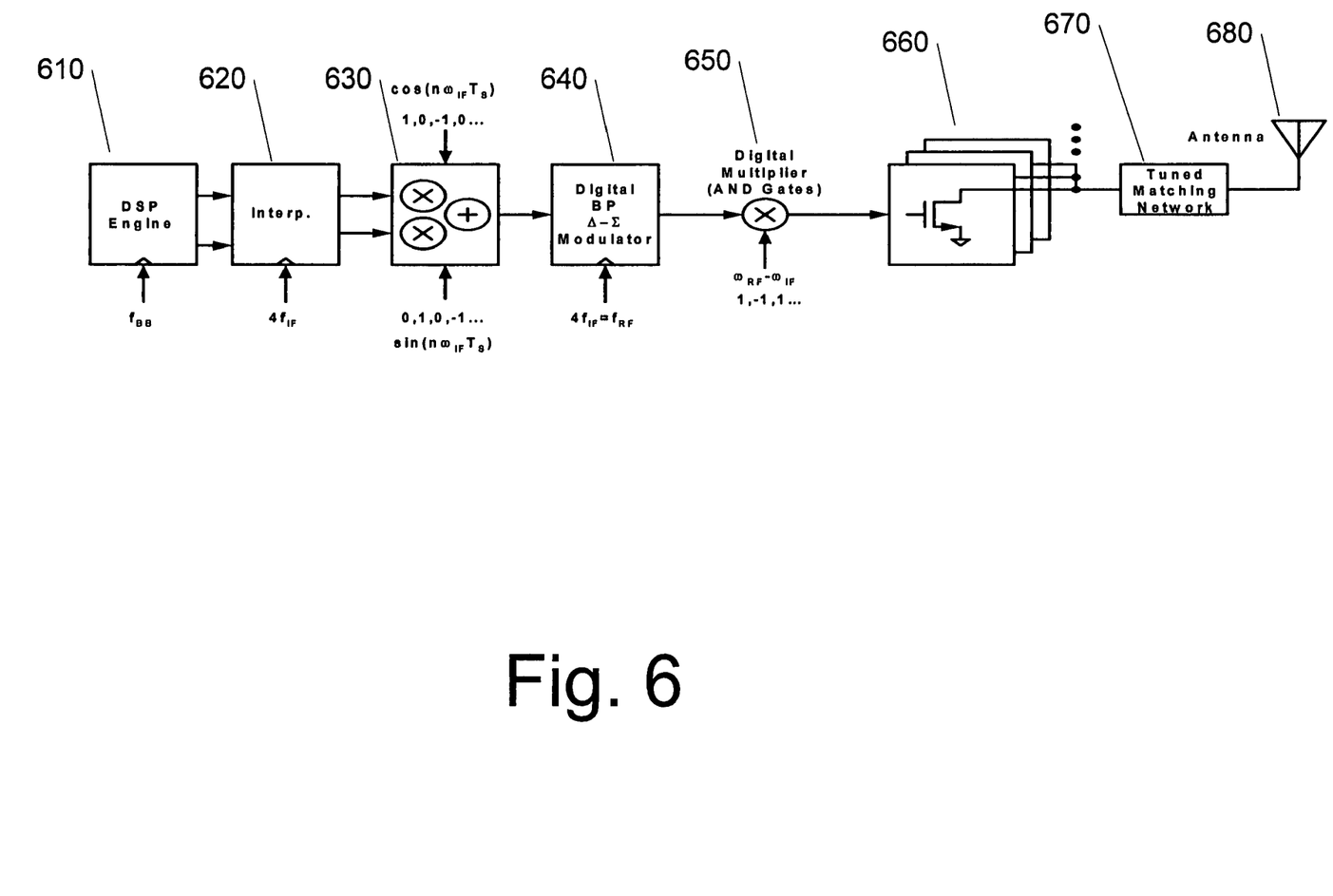
FIG. 6 is a high-level block diagram of one embodiment of a heterodyne architecture.

FIG. 6 is a high-level block diagram of one embodiment of a heterodyne architecture. To reduce the power dissipation involved in clocking the interpolator and delta-sigma modulator and driving the power amplifiers at four times the baseband frequency, a heterodyne scheme using an IF frequency given by $f_{IF}=(1/5)*f_{RF}$ can also be used. The example of FIG. 6 illustrates a single path through a multi-path transmission architecture.

In one embodiment, DSP engine 610 may generate two digital base-band sinusoid signals for each of two or more paths through the transmission circuit. In one embodiment, each pair of digital base-band sinusoid signals may operate as input signals to interpolator 620 that may interpolate the input signals to the IF frequency.

In one embodiment, interpolator 620, mixing circuit 630 and modulator 640 may operate at a sampling rate (clock frequency) $f_S=4*f_{IF}=(4/5)*f_{RF}$ to exploit a simple mixer and resonator realization. In one embodiment, the quantized signal may be mixed to the RF frequency through digital multiplier 650, which may be implemented, for example, as one or more AND gates. The output of digital multiplier 650 may be used to drive the switching power amplifier 660. The output of switching power amplifier 660 may be transmitted via tuned matching network 670 and antenna 680.

The quantization noise at a given offset frequency may be higher and the images may be closer in the architecture of FIG. 6 as compared to the homodyne architecture discussed above. However, these components may be attenuated using bandpass filtering in a matching network, combiner and SAW filter and diplexer. The architecture of FIG. 6 may be extended to the general case of $f_{IF}=4f_{RF}/(2k+1)$ where k=0, 1, 2, 3 . . . .

Figure 7:
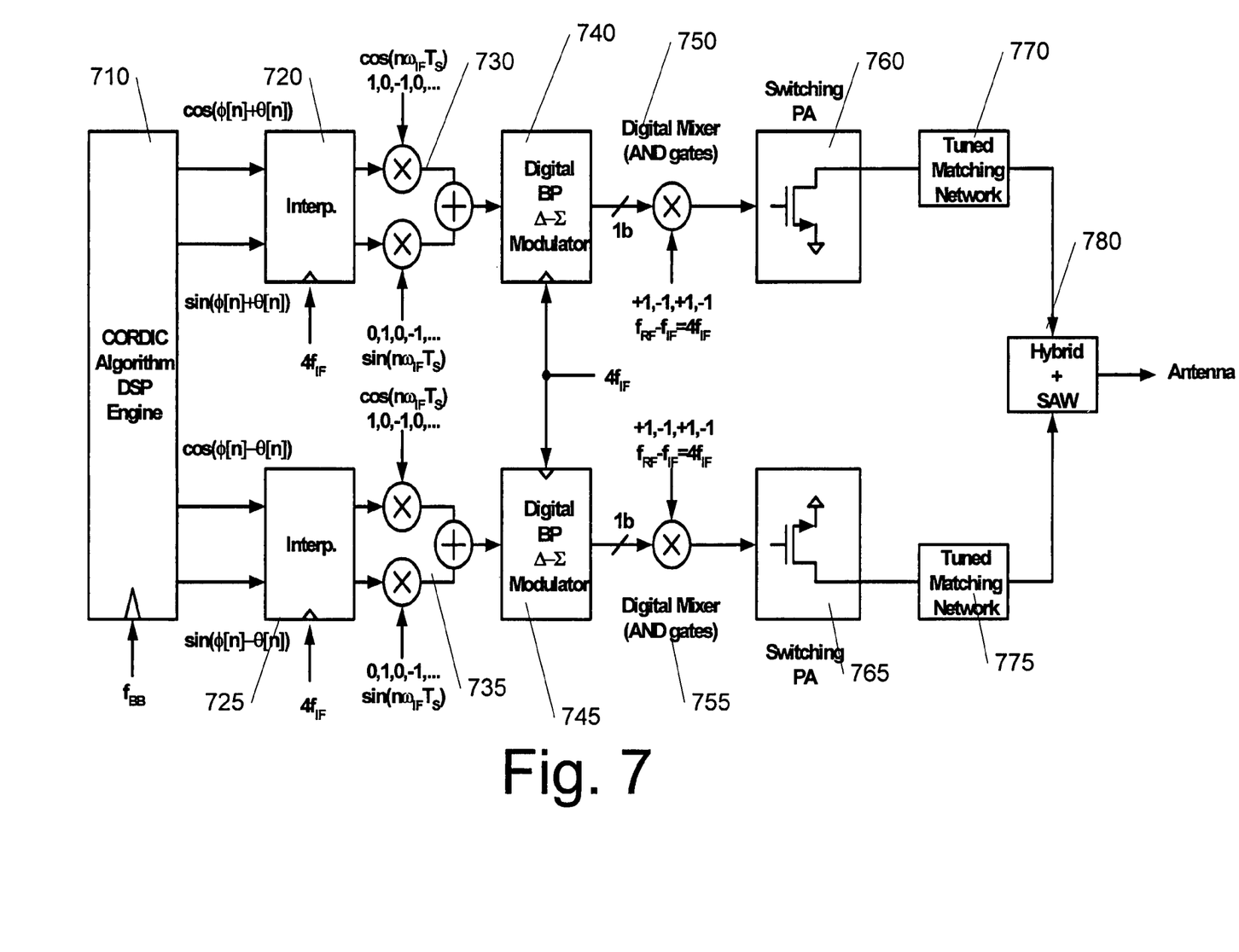
FIG. 7 is a block diagram of one embodiment of a basic heterodyne architecture.

FIG. 7 is a block diagram of one embodiment of a basic heterodyne architecture. In one embodiment, DSP engine 710 may generate two digital base-band sinusoid signals for each of two or more paths through the transmission circuit. In one embodiment, DSP engine 710 may be a CORDIC algorithm DSP engine; however, any type of DSP engine that is capable of generating the appropriate digital base-band signals may be used.

In one embodiment, each pair of digital base-band sinusoid signals may operate as input signals to interpolators (e.g., 720, 725) that may interpolate the input signals to a frequency that is a multiple (e.g., 2, 4, 8) of the IF frequency.

In one embodiment, the interpolated digital signals may be mixed through multiplication with a binary or ternary sequence by mixing circuitry 730 and 735. Any type of mixing circuitry known in the art may be used. The mixed signals may be used as input signals to modulators. In one embodiment, as discussed above, modulators 740 and 745 may be digital bandpass delta-sigma modulators. In one embodiment, the modulators are clocked by a frequency that is for times the IF.

The one-bit output stream from modulators 740 and 745 may be input to digital mixer 750 and 755, respectively that may be mixed to the RF frequency. The mixed signal may drive switching power amplifiers 760 and 765, respectively. Power amplifiers 760 and 765 may be realized using, for example, an inverter, an H-bridge or a switch transistor biased in class-D/E/F or biased in class-B/C and driven into saturation. In one embodiment, power amplifier output matching networks 770 and 775 and SAW filter 780 may suppress out-of-band noise. The resulting signal may be transmitted via one or more antennae (not illustrated in FIG. 7).

Figure 8:
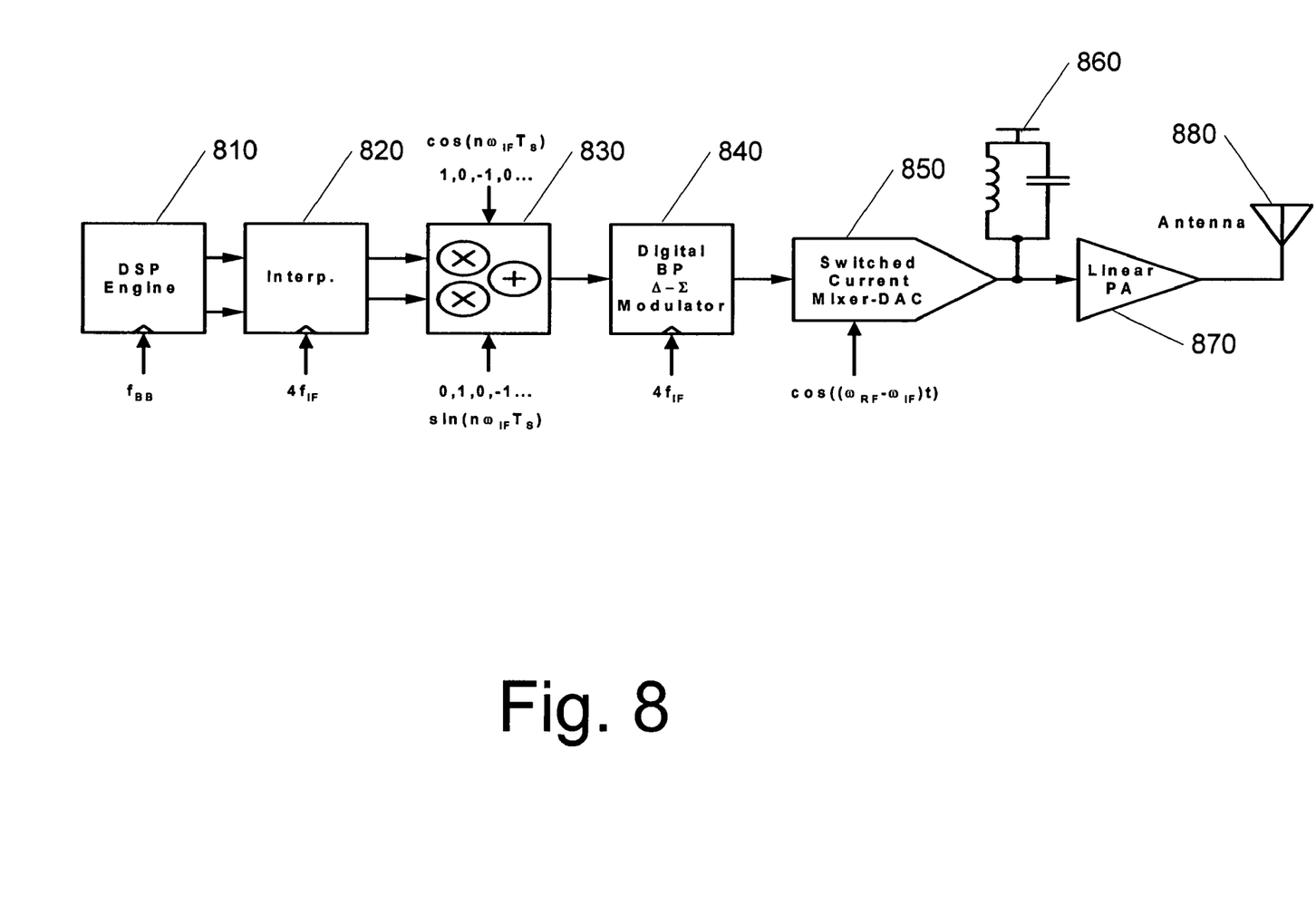
FIG. 8 is a high-level block diagram of one embodiment of a basic heterodyne architecture having a semi-digital mixer/digital-to-analog converter.

FIG. 8 is a high-level block diagram of one embodiment of a basic heterodyne architecture having a semi-digital mixer/digital-to-analog converter. In one embodiment, the input signal with a desired numerical precision may be generated by DSP 810 at the Nyquist rate of the baseband frequency. In one embodiment, the baseband signal may be interpolated to 4 times the desired IF frequency by interpolator 820. Any interpolation technique may be used.

In one embodiment, a multi-bit output from interpolator 820 may be digitally mixed by mixing circuitry 830 and provided as an input signal to digital bandpass delta-sigma (Δ–Σ) modulator 840. Modulator 840 may modulate the signal as described above. The output signal from modulator 840 input to switched current mixer/digital-to-analog converter (semi-digital DAC-filter) 850. In one embodiment, IF signals may be passed through semi-digital DAC-filter 850 to filter the nearby quantization noise spectrum, then mix the signal to the RF frequency to drive out-phasing power amplifiers 870.

In one embodiment, delayed and weighted outputs of modulator 840 may be combined to implement a filter. The weighting and combining may be simplified in fully integrated implementations by employing a switch current cell for weighting. The cell may use a current source (low frequency circuit) and a differential current steering core. Weighting may be obtained by using current sources in parallel and a simple wire connecting all the switch current cells to provide current summation.

In one embodiment, the second stage of mixing can be combined into DAC-Filter 850. This technique may be reconfigured in number of taps and weight for different transmission protocols. The resulting circuit may be relatively compact, low power, scale well (by employing only switches) and may not be very sensitive to matching or jitter. The output signal from DAC-filter 850 may be use to drive two or more switching power amplifiers 870, which may generate a signal to be transmitted via tuned matching network 860 and antenna 880.

Figure 9:
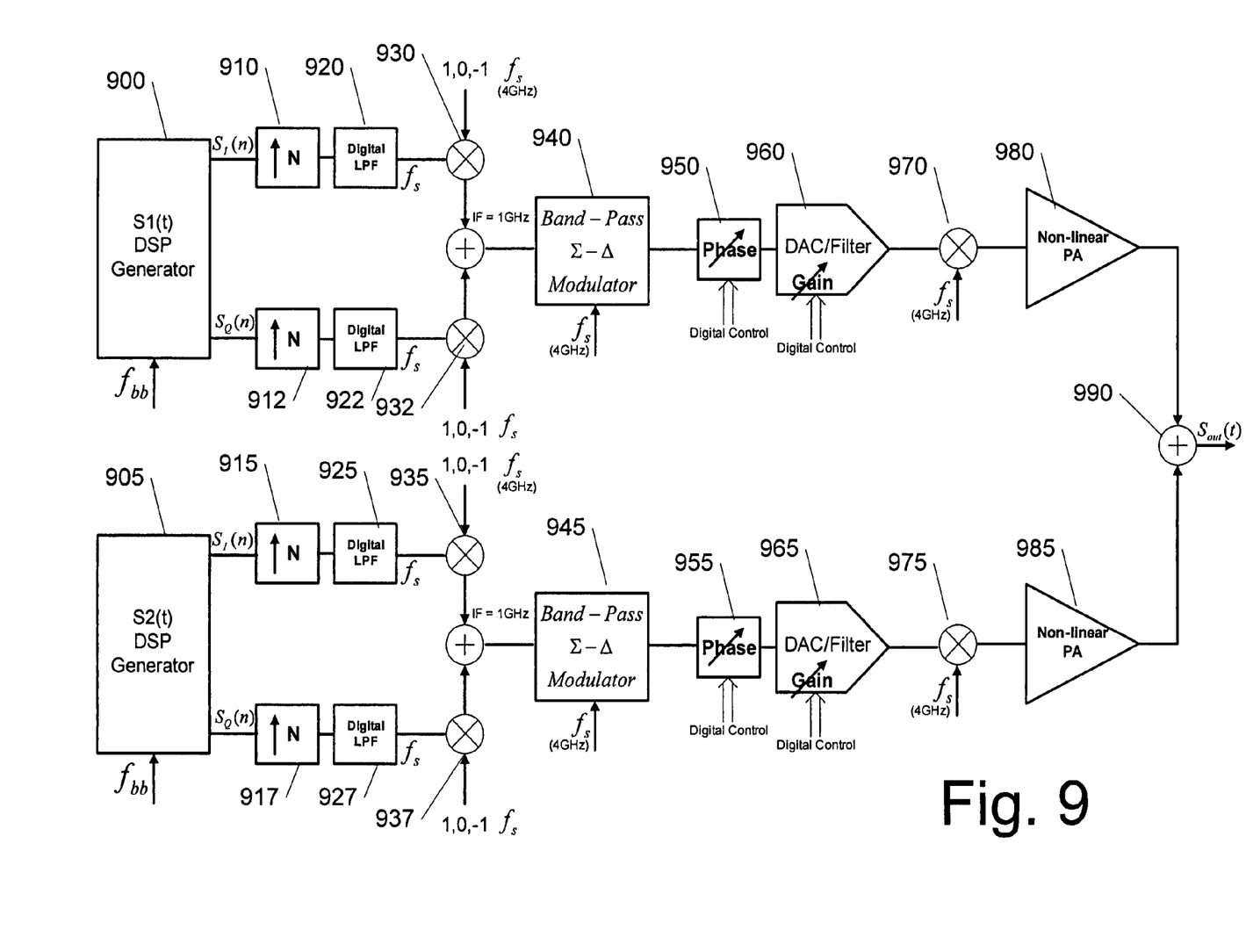
FIG. 9 is a block diagram of one embodiment of an outphasing amplifier transmitter system.

FIG. 9 is a block diagram of one embodiment of an out-phasing amplifier transmitter system. In general, the architecture of FIG. 9 may include two power amplifiers driven by two streams of constant envelope signals $s_1(t)$ and $s_2(t)$ that describe any amplitude and phase modulated signals. The final output signal may be the summation of both signals. Internally, a modulator may map amplitude into phase information.

In one embodiment, DSP generators 900 and 905 each may generate two streams of constant envelope signals. The signals may be upconverted (910, 912, 915, 917), passed through low pass filters (920, 922, 925, 927) and mixed (930, 932, 935, 937) with a binary or ternary signal before each of the two signals are combined at the IF frequency for each path.

The signals may then be passed to bandpass sigma-delta modulators 940 and 945, which function as described above. In one embodiment, the phase of the modulated signal may be adjusted (950 and 955) via digital control. Various techniques for adjusting the phase of the signal are described in greater detail below. The (optionally) phase-adjusted signal may then be provided to semi-digital DAC/filters 960 and 965, which function as described above. In one embodiment, semi-digital DAC/filters 960 and 965 include an adjustable gain functionality that may be controlled as described in greater detail below.

The signals output from semi-digital DAC/filters 960 and 965 may be mixed (970 and 975) and used to drive non-linear power amplifiers 980 and 985, respectively. The signals output from power amplifiers 980 and 985 may be combined (990) and transmitted by any appropriate technique.

Although, it may appear that the digital advantage may be lost at the IF stage, the concept of mapping gain/phase unbalance between the two paths into digital DSP adjustments can explain the advantage of this solution over a single path architecture composed of a modulator driving a single switching power amplifier. In this way, external filtering requirements may be more relaxed and can have practical specifications. For the same reason, each out-phasing amplifier can be implemented as parallel power amplifiers, and thus enabling achieving higher output power from a lower supply voltage without the risk of transistor breakdown, and also reducing hot-carrier effects.

Figure 10:
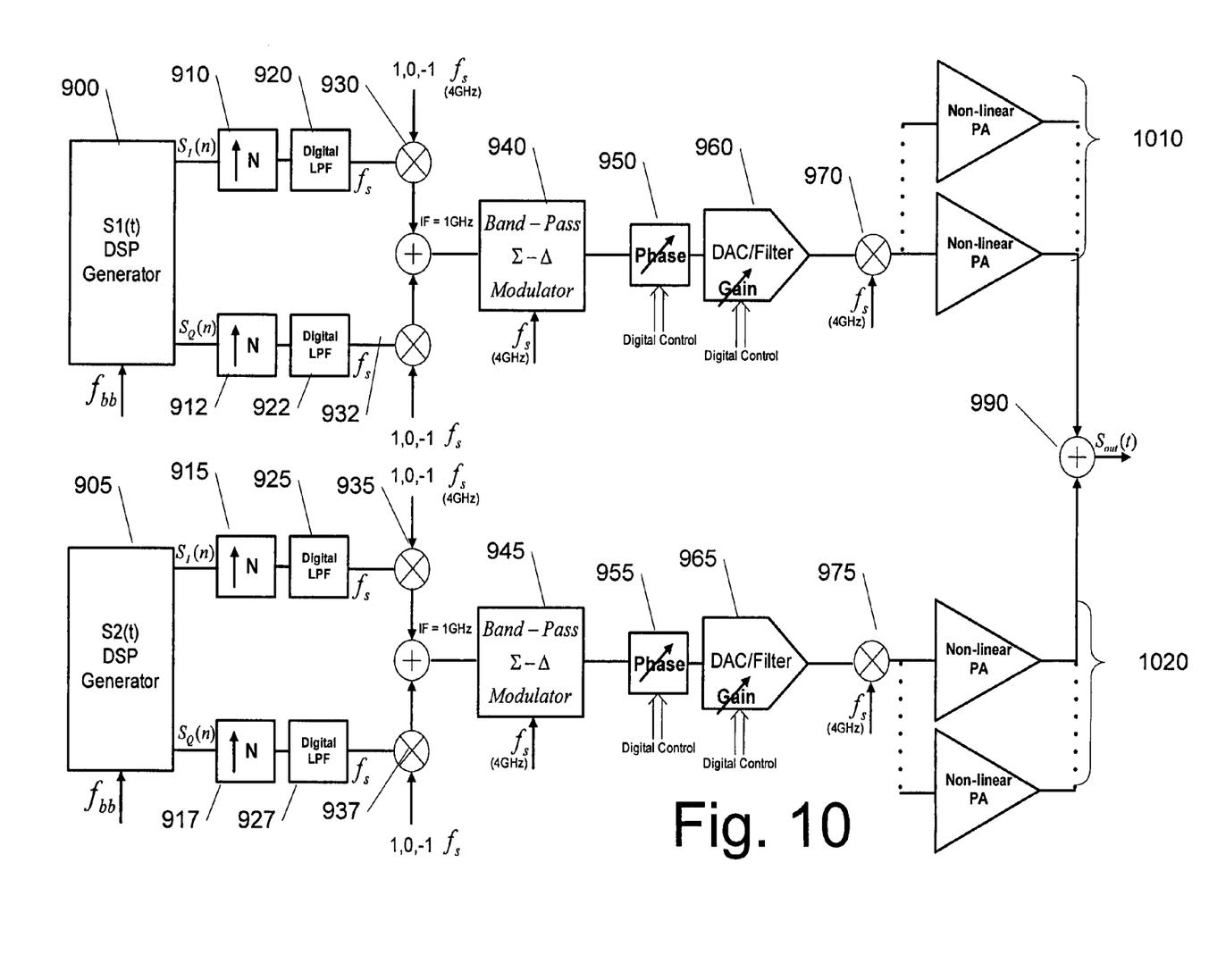
FIG. 10 is a block diagram of one embodiment of an out-phasing amplifier transmitter system having parallel power amplifier structures.

FIG. 10 is a block diagram of one embodiment of an out-phasing amplifier transmitter system having parallel power amplifier structures. The transmitter system of FIG. 10 may operate in the same manner as the transmitter system of FIG. 9 except that each of the two power amplifiers (980 and 985) may be replaced by groups of parallel power amplifiers 1010 and 1020. The transmitter system of FIG. 10 may provide higher power output than the transmitter system of FIG. 9 while maintaining relatively low distortion.

Figure 11:
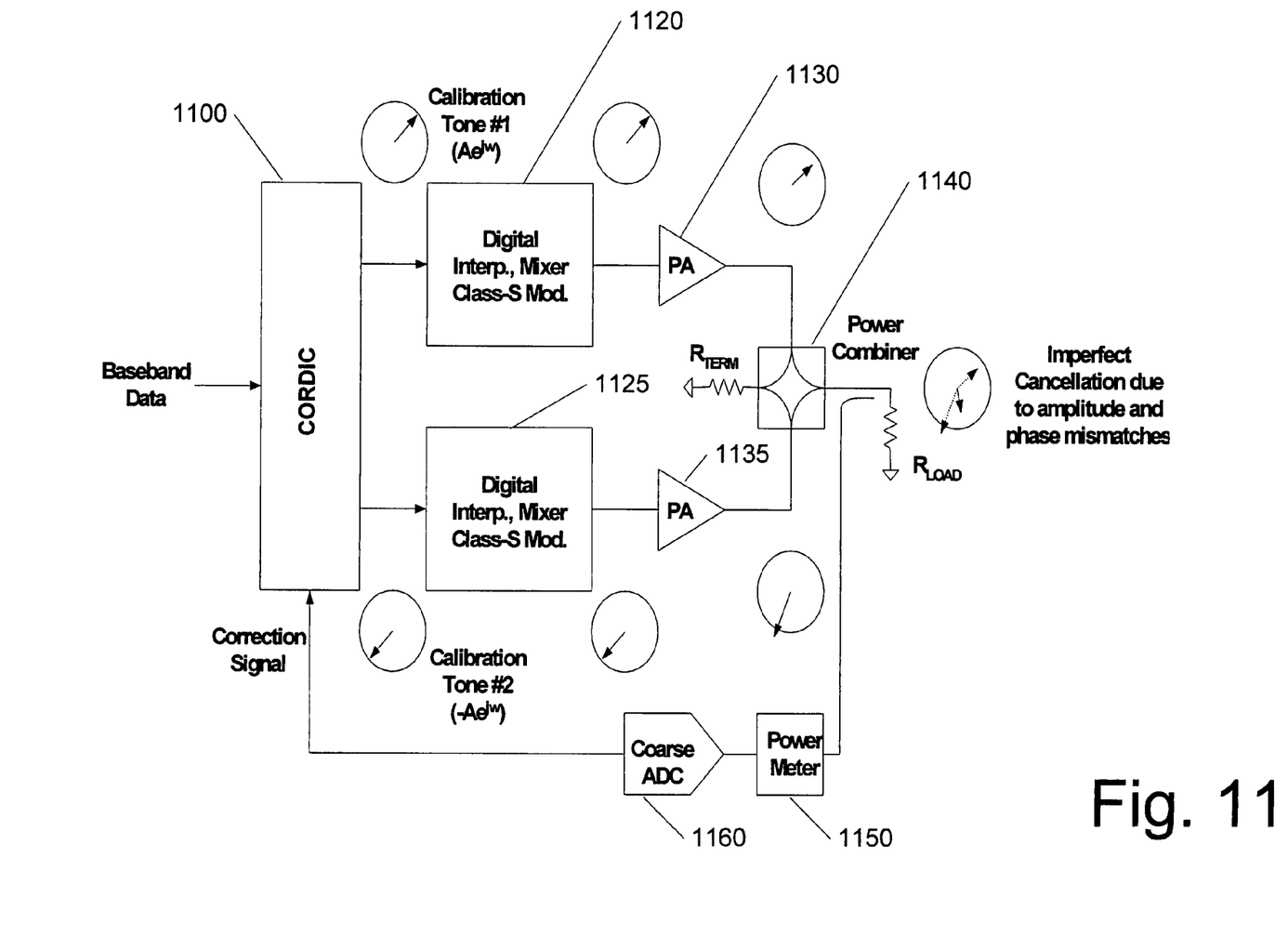
FIG. 11 is a high-level block diagram of one embodiment of a transmitter system with calibration and/or correction functionality.

FIG. 11 is a high-level block diagram of one embodiment of a transmitter system with calibration and/or correction functionality. Amplitude and phase imbalance in the two paths may result in distortion. In general, the two phase modulated components have a wider bandwidth than the final output. Mismatches in the two paths may result in imperfect cancellation outside the desired signal bandwidth and results in spectral widening.

In one embodiment, the imbalance may be digitally corrected in a calibration phase. Two base-band signals generated by DSP 1100 may be nominally anti-phase. The two signals may be passed through modulators 1120 and 1125 as well as power amplifiers 1130 and 1135 to power combiner 1140. When combined, the resulting signal may be measured by power meter 1150 (to monitor the output power) should ideally detect a null. However due to the gain and phase imbalances between the two paths, the signals may not cancel. The resulting signal may be used to indicate an error or phase imbalance that may be corrected.

Power meter 1150 could be realized using a simple circuit such as, for example, with Schottky diodes. Power meter 1150 output may be digitized by analog-to-digital converter (ADC) 1160 and fed back to DSP 1100. In one embodiment, DSP 1100 may adaptively adjust the amplitude and phase of $\tilde{s}_1(t)$ and $\tilde{s}_2(t)$ to produce a null in the power meter output. The amplitude and phase correction coefficients may be stored for use in normal (non-calibration) operation.

Figure 12:
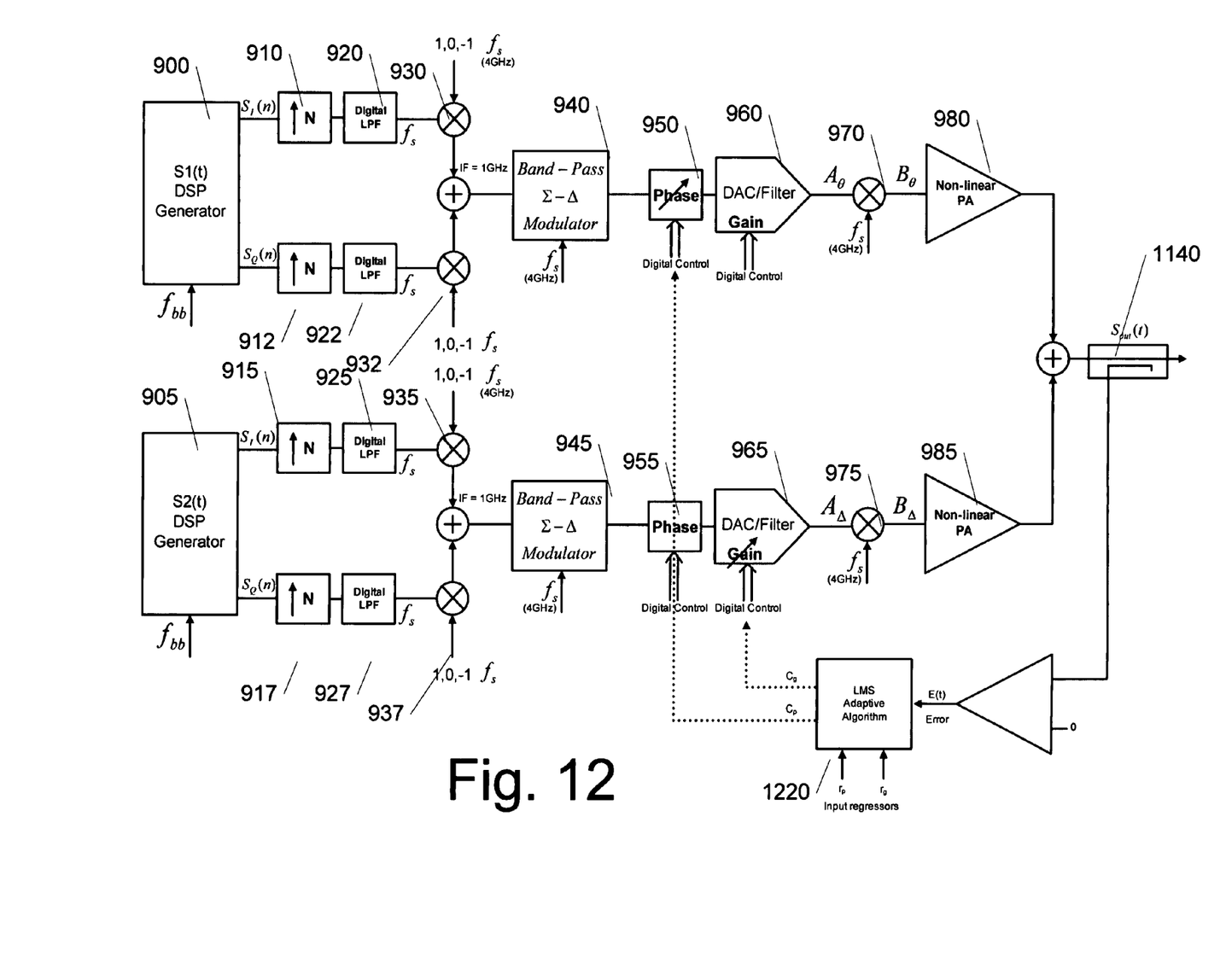
FIG. 12 is a block diagram of one embodiment of an out-phasing amplifier transmitter system have calibration/correction functionality.

FIG. 12 is a block diagram of one embodiment of an out-phasing amplifier transmitter system have calibration/correction functionality. The desired correction may be applied either at baseband or at IF/RF frequency. The baseband phase correction may be applied by adding/subtracting an offset phase ($\theta_{corr}$) from the two outphasing baseband signals while the amplitude correction is similarly applied to the term A. For IF calibration, a digitally controlled reference current may be used to adjust the gain unbalance between the two paths. Phase unbalance can be calibrated by using a digitally controlled variable delay in each path.

In one embodiment, the total gain/phase unbalance of each out-phasing path may be digitally compensated for. This property is not found if the parallel amplifiers are implemented within single-path transmitter architecture, thus enabling the architectures described herein to achieve higher output power with lower distortion than traditional single-path transmitter architectures. The correction coefficients may be derived using any adaptive algorithm, for example, least mean square (LMS) 1220, linear search etc. The calibration may be performed on power-up, on switching channels and/or between transmit bursts as often as required (due to drifts with temperature etc.).

In one embodiment, the binary or ternary output of the modulator may drive a switching power amplifier realized using an inverter, an H-bridge or a switch transistor biased in class-D/E/F or biased in class-B/C and driven into saturation. The matching network and the combiner can be realized on a high resistivity silicon compatible backplane substrate, on the package or on the board, where passive devices with moderate quality factors (Q~10) can be obtained.

If the power amplifier is biased in class-B or class-C and driven into saturation (to approximate a voltage driver) then a Chireix power combiner may be used to correct for the power factor of the individual power amplifiers and thereby achieve a higher efficiency. If a regular passive power combiner is used then the power lost in the partial cancellation of the two component signals when synthesizing an output with smaller amplitude can be harvested and re-cycled into the power supplies.

Figure 13:
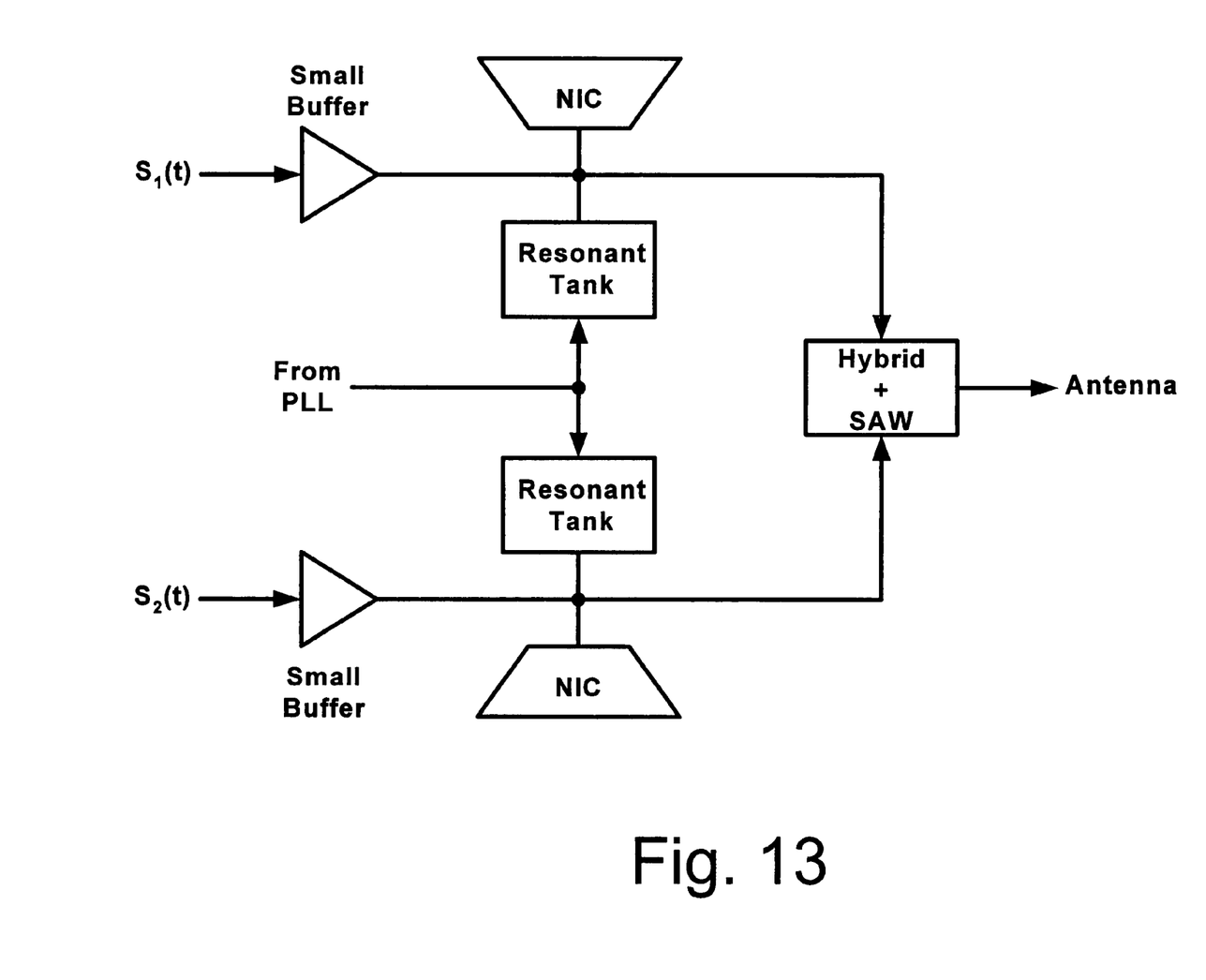
FIG. 13 is a block diagram of one embodiment of an architecture for injection locking power oscillators to reduce power amplifier drive power.

In one embodiment, to reduce the pre-driver power involved in driving the power amplifier, the power amplifier can be configured as a power oscillator. The power oscillator may then be injection locked to the desired modulation signal after up-conversion. Because injection locking can occur at significantly lower power levels (on account of the regeneration in the oscillator), the pre-driver signal can be reduced resulting in lower pre-driver power dissipation. To reconstruct the amplitude information two power amplifiers injection locked to two phase-modulated signals $s_1(t)$ and $s_2(t)$ can be used, one embodiment of which is illustrated in FIG. 13.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method comprising:
   two digital signal processor (DSP) generators that each generate two streams of constant envelope signals;
   performing digital amplitude modulation and digital phase modulation with a pair of sigma-delta modulators coupled with the two DSP generators on a plurality of base-band sinusoid signals to generate corresponding digital modulated signals;
   driving a plurality of non-linear power amplifiers with the digital modulated signals, wherein the power amplifiers are configured as power oscillators that are injection locked to the digital modulated signals after upconversion;
   providing digital compensation for a total gain/phase unbalance of each signal path; and
   combining output signals from the power amplifiers with a passive power combiner.

2. The method of claim 1 further comprising:
   adjusting the phase of the modulated signals via digital control; and
   providing the phase-adjusted, modulated signals to one or more semi-digital DAC/filters.

3. The method of claim 1 wherein the plurality of base-band sinusoid signals comprises two base-band sinusoid signals and the plurality of power amplifiers comprises two power amplifiers.

4. The method of claim 1 wherein the plurality of power amplifiers comprises N power amplifiers where N is an even number greater than 2.

5. The method of claim 1 further comprising transmitting the combined output signal.

6. The method of claim 1 wherein the modulation is performed by a digital delta-sigma modulator.

7. The method of claim 1, wherein the plurality of base-band sinusoid signals comprise two anti-phase signals, the method further comprising:
   determining an error in response to the combined output signal from the power amplifiers;
   using the error to modify generation of subsequent base-band sinusoid signals.

8. An apparatus comprising:
   digital signal generation circuitry to generate at least two base-band sinusoid signals derived from a pair of phasors having the same amplitude and centered at the same frequency with varying phases;
   bandpass modulation circuitry coupled to receive the base-band sinusoid signals and to generate at least two modulated digital signals;
   at least two power amplifiers coupled to receive the at least two modulated digital signals to amplify the modulated digital signals, wherein the power amplifiers are configured as power oscillators that are injection locked to the digital modulated signals after upconversion; and
   a passive power combiner coupled with the at least two power amplifiers to combine amplified digital signals for transmission.

9. The apparatus of claim 8 further comprising one or more semi-digital DAC/filters coupled to receive the phase of the modulated signals.

10. The apparatus of claim 8 wherein the modulation is performed by a digital delta-sigma modulator.

11. The apparatus of claim 8 further comprising one or more antenna coupled with the circuitry to combine the digital signals to transmit the combined amplified signal.

12. The apparatus of claim 8, wherein the plurality of base-band sinusoid signals comprise two anti-phase signals, the apparatus further comprising:
   an error determination circuit coupled power amplifiers, the error determination circuit to determine an error in response to the combined output signal from the power amplifiers; and
   feedback circuitry coupled with the error determination circuit to utilize the error to modify generation of subsequent base-band sinusoid signals.

13. The apparatus of claim 8 wherein the plurality of base-band sinusoid signals comprises two base-band sinusoid signals and the plurality of power amplifiers comprises two power amplifiers.

14. The apparatus of claim 8 wherein the plurality of power amplifiers comprises N power amplifiers where N is an even number greater than 2.

* * * * *